United States Patent
Ogura

(10) Patent No.: US 11,264,955 B2
(45) Date of Patent: Mar. 1, 2022

(54) SEMICONDUCTOR AMPLIFIER CIRCUIT AND SEMICONDUCTOR CIRCUIT

(71) Applicants: Kabushiki Kaisha Toshiba, Tokyo (JP); Toshiba Electronic Devices & Storage Corporation, Tokyo (JP)

(72) Inventor: Akio Ogura, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/919,599

(22) Filed: Jul. 2, 2020

(65) Prior Publication Data
US 2021/0044257 A1 Feb. 11, 2021

(30) Foreign Application Priority Data
Aug. 8, 2019 (JP) .............................. JP2019-146554

(51) Int. Cl.
| | | |
|---|---|---|
| H03F 1/32 | (2006.01) | |
| H03F 3/16 | (2006.01) | |
| H03K 5/24 | (2006.01) | |
| H03F 3/45 | (2006.01) | |

(52) U.S. Cl.
CPC ............ *H03F 1/3205* (2013.01); *H03F 3/16* (2013.01); *H03K 5/24* (2013.01); *H03F 2200/129* (2013.01)

(58) Field of Classification Search
CPC .... H03F 1/3205; H03F 3/16; H03F 2200/129; H03F 3/213; H03F 3/45192; H03F 3/45183; H03F 3/3022; H03F 1/3211; H03F 3/245; H03K 5/24
USPC .................................................. 330/252–261
See application file for complete search history.

(56) References Cited

U.S. PATENT DOCUMENTS

| | | | |
|---|---|---|---|
| 6,137,356 A | 10/2000 | Sakuragi | |
| 6,218,900 B1* | 4/2001 | Nolan | H03F 1/52 327/52 |
| 6,480,069 B2 | 11/2002 | Yasukouchi | |
| 7,142,055 B2 | 11/2006 | Inokuchi | |
| 8,896,378 B2 | 11/2014 | Hirose et al. | |
| 8,922,540 B2* | 12/2014 | Tsuchi | H03F 3/3022 345/211 |

FOREIGN PATENT DOCUMENTS

| | | |
|---|---|---|
| JP | 3478752 B2 | 12/2003 |
| JP | 4265865 B2 | 5/2009 |
| JP | 4407881 B2 | 2/2010 |
| JP | 4622499 B2 | 2/2011 |
| JP | 5503671 B2 | 5/2014 |

* cited by examiner

*Primary Examiner* — Hieu P Nguyen
(74) *Attorney, Agent, or Firm* — Allen & Overy LLP

(57) ABSTRACT

A semiconductor amplifier circuit has a driver that outputs a drive signal corresponding to an input signal and switches drive capability of the drive signal in accordance with a logic of an instruction signal, an instruction signal setting unit that sets the logic of the instruction signal in accordance with whether the input signal satisfies a predetermined condition, and an output circuit that comprises a control terminal to which the drive signal is input and an output terminal that outputs a signal obtained by amplifying the input signal.

12 Claims, 13 Drawing Sheets

SEMICONDUCTOR AMPLIFIER CIRCUIT AND SEMICONDUCTOR CIRCUIT

CROSS REFERENCE TO RELATED APPLICATIONS

This application is based upon and claims the benefit of priority from the prior Japanese Patent Application No. 2019-146554, filed on Aug. 8, 2019, the entire contents of which are incorporated herein by reference.

FIELD

Embodiments described herein relate generally to a semiconductor amplifier circuit and a semiconductor circuit.

BACKGROUND

In a sensor driven by a battery, an amplifier circuit that amplifies a weak output signal of the sensor is indispensable. Under the condition of battery driven, it is necessary to suppress the current consumption of the amplifier circuit as much as possible. Even when the output signal of the sensor changes at high speed, low distortion performance is required to perform amplification without distortion in accordance with the signal change.

However, in order to improve the low distortion performance of the amplifier circuit, it is typically necessary to increase the current flowing through the amplifier circuit, resulting in an increase in power consumption. In this manner, an amplifier circuit has a trade-off relationship between the low power consumption performance and the low distortion performance.

DETAILED DESCRIPTION

Figure 1:
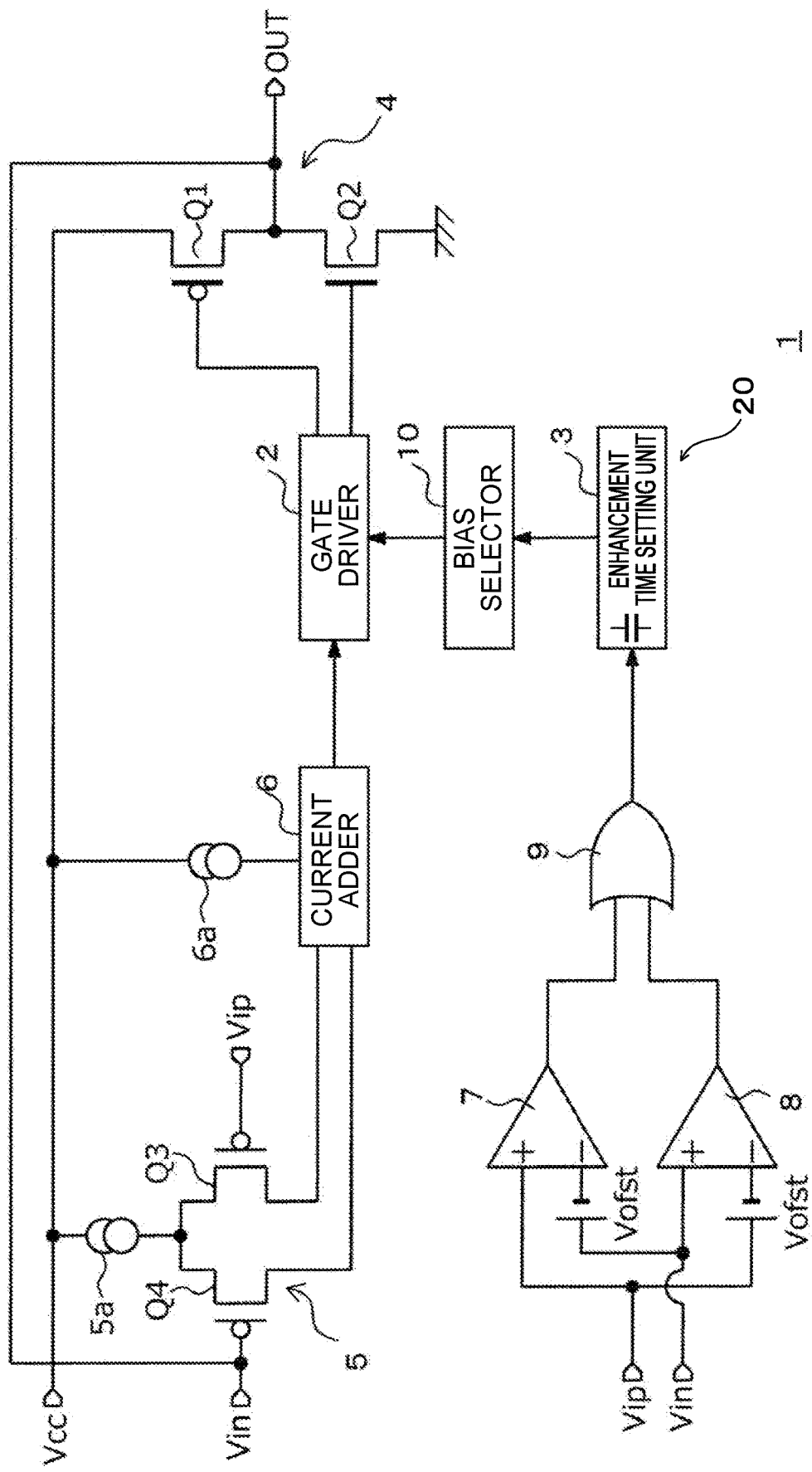
FIG. 1 is a block diagram of a semiconductor amplifier circuit according to a first embodiment.

According to one embodiment a semiconductor amplifier circuit has a driver that outputs a drive signal corresponding to an input signal and switches drive capability of the drive signal in accordance with a logic of an instruction signal, an instruction signal setting unit that sets the logic of the instruction signal in accordance with whether the input signal satisfies a predetermined condition, and an output circuit including a control terminal to which the drive signal is input and an output terminal that outputs a signal obtained by amplifying the input signal.

Hereinafter, embodiments will be described with reference to the drawings. In the present specification and the accompanying drawings, some components are omitted, changed, or simplified for explanation and illustration for ease of understanding and convenience of illustration. However, technical details from which similar functions can be expected should also be included and interpreted in the present embodiment. In the drawings attached hereto, for convenience of illustration and ease of understanding, the scales, the aspect ratios in the vertical and horizontal directions or the like have been exaggerated being changed from the actual ones.

First Embodiment

FIG. 1 is a block diagram of a semiconductor amplifier circuit 1 and a semiconductor circuit 20 according to a first embodiment. The semiconductor amplifier circuit 1 and the semiconductor circuit 20 in FIG. 1 are circuits formed on a semiconductor substrate. Other circuits may also be mounted on the semiconductor substrate on which the semiconductor amplifier circuit 1 of FIG. 1 is formed. The application of the semiconductor amplifier circuit 1 in FIG. 1 is not particularly limited. Still, the semiconductor amplifier circuit 1 can be used to amplify a weak output signal detected by various sensors, for example.

The semiconductor amplifier circuit 1 of FIG. 1 includes a gate driver (driver) 2, an enhancement time setting unit (instruction signal setting unit) 3, and an output circuit 4 as major components. The semiconductor circuit 20 has a configuration obtained by removing the output circuit 4 from the semiconductor amplifier circuit 1. The semiconductor amplifier circuit 1 and the semiconductor circuit 20 may be formed on a same semiconductor substrate or may be formed on different semiconductor substrates.

The gate driver 2 outputs a gate drive signal (drive signal) corresponding to an input signal, and switches the drive capability of the gate drive signal in accordance with the logic of the drive enhancement signal (instruction signal). More specifically, the gate driver 2 outputs a gate drive signal corresponding to the input signal, and enhances the drive capability of the gate drive signal during a period in which a drive enhancement signal described below is a first logic. The first logic is, for example, a high level. The input signal may be a single voltage signal or a differential input signal including a first input signal Vip and a second input signal Vin. As will be described below, when a differential input signal is used as the input signal, the gate driver 2 outputs a gate drive signal corresponding to a voltage difference between the first input signal Vip and the second input signal Vin included in the differential input signal. The drive enhancement signal is an instruction signal that specifies whether to enhance the drive capability of the gate drive signal. Enhancing the drive capability of the gate drive signal includes raising or lowering the voltage level of the gate drive signal, for example. This accelerates the operation of the transistor in which the gate drive signal is input to the gate, making it possible to accelerate the operation of the output circuit 4.

The enhancement time setting unit 3 sets the logic of the drive enhancement signal depending on whether the input signal satisfies a predetermined condition. More specifically, the enhancement time setting unit 3 sets the drive enhancement signal to the first logic for a predetermined time after the input signal satisfies a predetermined condition, and sets the drive enhancement signal to the second logic when the predetermined time has elapsed. Cases of satisfying the predetermined condition includes a case where the input signal is a differential input signal and where the absolute value of the voltage difference between the first input signal Vip and the second input signal Vin included in the differential input signal is greater than an offset voltage Vofst. In a case where the absolute value of the voltage difference between the first input signal Vip and the second input signal Vin is the offset voltage Vofst or less, the predetermined condition is not satisfied. The gate driver 2 enhances the drive capability of the gate drive signal when the drive enhancement signal is set to the first logic, and sets the gate drive signal to the normal drive capability when the drive enhancement signal is set to the second logic.

The output circuit 4 includes a control terminal to which a gate drive signal is input and an output terminal that outputs a signal obtained by amplifying the input signal. More specifically, the output circuit 4 includes a transistor having a gate to which a gate drive signal is input, and outputs, from the transistor, an amplified signal obtained by amplifying the input signal. More specifically, the output circuit 4 includes a PMOS transistor Q1 and an NMOS transistor Q2 that are cascode-connected between a power supply voltage node and a ground node. The drain of the PMOS transistor Q1 and the drain of the NMOS transistor Q2 are connected to an output terminal OUT. A first gate drive signal is input to the gate of the PMOS transistor Q1, and a second gate drive signal is input to the gate of the NMOS transistor Q2. These first gate drive signal and second gate drive signal are generated by the gate driver 2. In a case where the enhancement time setting unit 3 sets the drive enhancement signal to the first logic, the voltage level of the first gate drive signal becomes lower and the PMOS transistor Q1 turns on rapidly, or the voltage level of the second gate drive signal becomes higher and the NMOS transistor Q2 turns on rapidly.

In addition, the semiconductor amplifier circuit 1 of FIG. 1 may include a differential input circuit 5 and a current adder 6.

The differential input circuit 5 includes a constant current source 5a and a pair of first conductivity type PMOS transistors Q3 and Q4. A differential input signal including the first input signal Vip and the second input signal Vin is input to the gates of the PMOS transistors Q3 and Q4, respectively. The differential input circuit 5 outputs a current corresponding to the voltage difference between the first input signal Vip and the second input signal Vin. The first input signal Vip and the second input signal Vin included in the differential input signal are at the same voltage level in a stable state, while the first input signal Vip and the second input signal Vin have a voltage difference in a transient state where the signal logic transitions. The differential input circuit 5 outputs a current corresponding to the voltage difference between the first input signal Vip and the second input signal Vin. The current output from the differential input circuit 5 is then input to the current adder 6.

An output terminal OUT is connected to the gate of the PMOS transistor Q4 to which the second input signal Vin is input. With this configuration, negative feedback control is performed to eliminate the voltage difference between the first input signal Vip and the second input signal Vin.

The current adder 6 outputs a voltage corresponding to the current obtained by adding the current from the constant current source 6a to the current output from the differential input circuit 5. The voltage output from the current adder 6 has a voltage level corresponding to the voltage difference between the first input signal Vip and the second input signal Vin. The voltage output from the current adder 6 is input to the gate driver 2.

In this manner, the current adder 6 adds the current from the constant current source 6a to the current output from the differential input circuit 5, making it possible to enhance the gain. Furthermore, the current adder 6 can expand a common-mode input voltage range of the first input signal Vip and the second input signal Vin included in the differential input signal. The operation of the current adder 6 will be described below.

In addition, the semiconductor amplifier circuit 1 of FIG. 1 may include a first comparator 7, a second comparator 8, an OR circuit 9, and a bias selector 10.

The first comparator 7 detects whether a voltage difference obtained by subtracting the voltage level of the second input signal Vin from the voltage level of the first input signal Vip is greater than the offset voltage Vofst. The first comparator 7 indicates a high potential when Vip>Vin+ offset voltage Vofst is satisfied, for example.

The second comparator 8 detects whether a voltage difference obtained by subtracting the voltage level of the first input signal Vip from the voltage level of the second input signal Vin is greater than the offset voltage Vofst. The first comparator 7 indicates a high potential when Vin>Vip+ offset voltage Vofst is satisfied, for example.

The OR circuit 9 is a logical operation circuit that calculates a logical sum of an output signal of the first comparator 7 and an output signal of the second comparator 8 and outputs a calculation result. Therefore, the OR circuit 9 outputs a high potential in a case where the first comparator 7 outputs a high potential or where the second comparator 8 outputs a high potential. More specifically, the OR circuit 9 outputs a high potential in a case where Vip>Vin+ offset voltage Vofst is satisfied or where Vin>Vip+offset voltage Vofst is satisfied.

The case where the OR circuit 9 outputs a high potential corresponds to the case where the predetermined condition described above is satisfied. Therefore, the enhancement time setting unit 3 sets the drive enhancement signal to the first logic for a predetermined time in a case where the OR circuit 9 outputs a high potential, and sets the drive enhancement signal to the second logic when the predetermined time has elapsed. In this manner, the enhancement time setting unit 3 sets the drive enhancement signal to the first logic only when the output of the OR circuit 9 has changed from the low potential to the high potential. In a case where a logical operation circuit such as a NOR circuit that outputs a negative logic signal is used instead of the OR circuit 9, the enhancement time setting unit 3 sets the drive enhancement signal to the first logic only when the output of the logical operation circuit has changed from the high potential to the low potential.

The above-described enhancement time setting unit 3 may incorporate a capacitor. This capacitor immediately stores charges when the OR circuit 9 outputs a signal of a predetermined logic (for example, a high potential), while the capacitor discharges the stored charges over time when the OR circuit 9 outputs a signal of a logic other than the predetermined logic. The enhancement time setting unit 3 sets the drive enhancement signal to the first logic in a case where the capacitor has stored charges of a predetermined amount or more.

As will be described below, the bias selector 10 selects the voltage level of the bias voltage in the gate driver 2 on the basis of the drive enhancement signal output from the enhancement time setting unit 3. In this manner, switching the voltage level of the bias voltage in the gate driver 2 enables switching of the drive capability of the gate drive signal.

Figure 2:
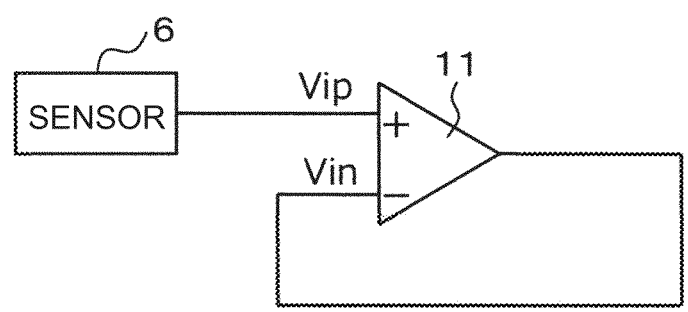
FIG. 2 is a diagram illustrating a differential input signal of FIG. 1.

FIG. 2 is a diagram illustrating the differential input signal of FIG. 1. FIG. 2 illustrates an example in which the semiconductor amplifier circuit 1 according to the present embodiment is replaced with an operational amplifier 11. As illustrated in FIG. 2, a signal output from the various sensors 12 is input to a positive input terminal of the operational amplifier 11. The negative input terminal of the operational amplifier 11 is short-circuited to the output terminal OUT. In this case, the operational amplifier 11 operates so that the voltage difference between the positive input terminal and the negative input terminal becomes zero. The differential input signal described above includes the first input signal Vip connected to the positive input terminal of the operational amplifier 11 and the second input signal Vin connected to the negative input terminal.

In a case where the voltage level of the output signal of the sensor 12 suddenly rises, the voltage level of the first input signal Vip also rises sharply. However, the output voltage of the operational amplifier 11 would not rise immediately, leading to generation of a transient voltage difference between the first input signal Vip and the second input signal Vin. This voltage difference is eventually eliminated, and the first input signal Vip and the second input signal Vin will have a same voltage. The reason why the voltage change of the output signal of the operational amplifier 11 is delayed with respect to the voltage change of the output signal of the sensor 12 is that the operational amplifier 11 has a phase compensation capacitance and an internal parasitic capacitance.

Even in a case where the output signal of the sensor 12 is input to the semiconductor amplifier circuit 1 according to the present embodiment, a transient voltage difference occurs between the first input signal Vip and the second input signal Vin included in the differential input signal when the logic of the first input signal Vip that is the output signal of the sensor 12 changes, similarly to FIG. 2. The semiconductor amplifier circuit 1 according to the present embodiment enhances the drive capability of the gate drive signal only for a predetermined time when a transient voltage difference occurs between the first input signal Vip and the second input signal Vin.

Figure 3:
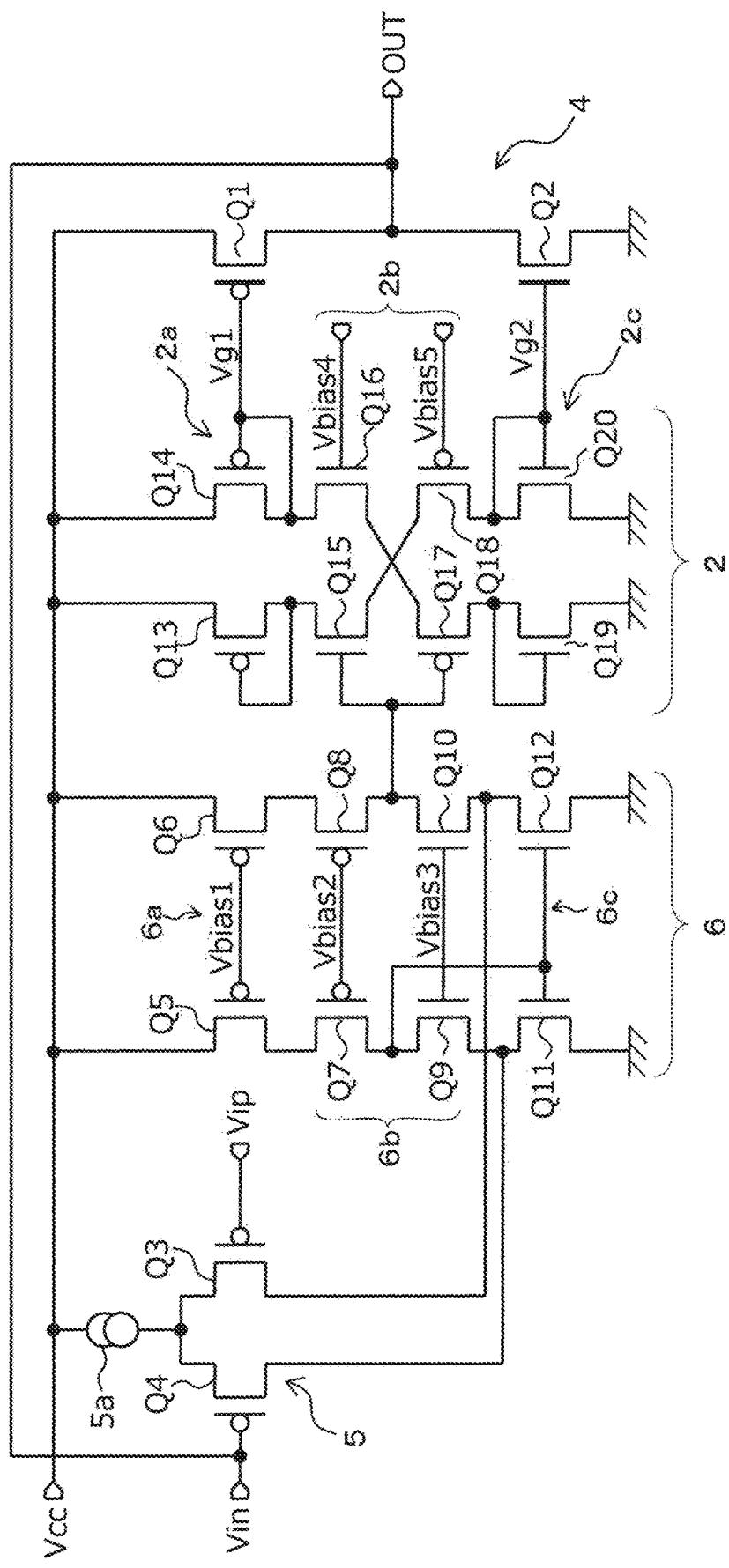
FIG. 3 is a circuit diagram illustrating an example of a detailed internal configuration of a current adder, a gate driver, and an output circuit of FIG. 1.

FIG. 3 is a circuit diagram illustrating an example of a detailed internal configuration of the current adder 6, the gate driver 2, and the output circuit 4 of FIG. 1. FIG. 3 omits illustration of the enhancement time setting unit 3, the first comparator 7, the second comparator 8, the OR circuit 9, and the bias selector 10 illustrated in FIG. 1.

The current adder 6 in FIG. 3 includes a gain enhancement circuit 6b, and a current adder circuit 6c, which are connected to a constant current source 6.

The constant current source 6a includes a pair of PMOS transistors Q5 and Q6. The gates of PMOS transistors Q5 and Q6 are supplied with a bias voltage Vbias1, and the sources thereof are supplied with a power supply voltage.

The gain enhancement circuit 6b includes a pair of PMOS transistors Q7 and Q8 and a pair of NMOS transistors Q9 and Q10. The gates of PMOS transistors Q7 and Q8 are supplied with a bias voltage Vbias2, while the sources thereof are connected with the drains of the pair of PMOS transistors Q5 and Q6. The gates of NMOS transistors Q9 and Q10 are supplied with a bias voltage Vbias3, while the drains thereof are connected with the drains of the pair of PMOS transistors Q7 and Q8.

The current adder circuit 6c includes a pair of NMOS transistors Q11 and Q12. The drain of the NMOS transistor Q9 is connected to the gates of the pair of NMOS transistors Q11 and Q12. The drains of the pair of PMOS transistors Q4 and Q3 in the differential input circuit 5 are connected to the drains of the pair of NMOS transistors Q11 and Q12. The sources of the pair of NMOS transistors Q11 and Q12 are grounded.

A constant current corresponding to the bias voltage Vbias1 flows between the source and drain of the pair of PMOS transistors Q5 and Q6 included in the constant current source 6a. The pair of PMOS transistors Q7 and Q8 and the pair of NMOS transistors Q9 and Q10 in the gain enhancement circuit 6b function as resistors according to the bias voltages Vbias2 and Vbias3, respectively. The constant current output from the constant current source 6a passes between the source and drain of the pair of PMOS transistors Q7 and Q8 and between the drain and source of the pair of NMOS transistors Q9 and Q10 and then flows into the current adder circuit 6c.

A current flowing between the source and drain of the pair of PMOS transistors Q3 and Q4 in the differential input circuit 5 also flows into the current adder circuit 6c. Accordingly, the current obtained by adding the current from the constant current source 6a and the current from the differential input circuit 5 flows between the drain and source of the pair of NMOS transistors Q11 and Q12 in the current adder circuit 6c.

The gate driver 2 includes a first gate signal generator 2a, a gain adjuster 2b, and a second gate signal generator 2c.

The first gate signal generator 2a includes a pair of PMOS transistors Q13 and Q14. A source voltage is supplied to the sources of the PMOS transistors Q13 and Q14, and the gate and drain of the PMOS transistors Q13 are short-circuited. Similarly, the gate and drain of the PMOS transistor Q14 are short-circuited.

The gain adjuster 2b includes a pair of NMOS transistors Q15 and Q16 and a pair of PMOS transistors Q17 and Q18. The drains of the NMOS transistors Q15 and Q16 are connected to the drains of the PMOS transistors Q13 and Q14, respectively. The source of the NMOS transistor Q15 is connected to the source of the PMOS transistor Q18. The source of the NMOS transistor Q16 is connected to the source of the PMOS transistor Q17. A bias voltage Vbias4 is input to the gate of the NMOS transistor Q16, and a bias voltage Vbias5 is input to the gate of the PMOS transistor Q18. The gate of the NMOS transistor Q15 and the gate of the PMOS transistor Q17 are connected to the drain of the PMOS transistor Q8 and the drain of the NMOS transistor Q10 which are output nodes of the current adder 6.

The second gate signal generator 2c includes a pair of NMOS transistors Q19 and Q20. The drain of the NMOS transistor Q19 is connected to the gate of the NMOS transistor Q19 and the drain of the PMOS transistor Q17.

The drain of the NMOS transistor Q20 is connected to the gate of the NMOS transistor Q20 and the drain of the PMOS transistor Q18. The sources of the NMOS transistors Q19 and Q20 are connected to the ground node.

The gate of the PMOS transistor Q1 in the output circuit 4 is connected to the gate and drain of the PMOS transistor Q14. The gate of the NMOS transistor Q2 is connected to the gate and drain of the NMOS transistor Q20.

Figure 4:
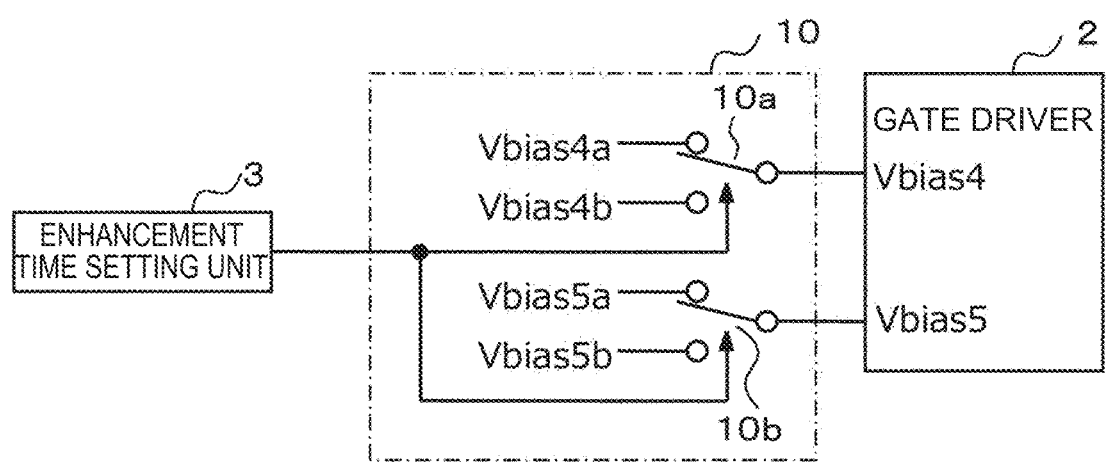
FIG. 4 is a circuit diagram illustrating an example of an internal configuration of a bias selector.

FIG. 4 is a circuit diagram illustrating an example of an internal configuration of the bias selector 10 that generates the bias voltages Vbias4 and Vbias5 supplied to the gain adjuster 2b in the gate driver 2. The bias selector 10 of FIG. 4 includes a first voltage selector 10a and a second voltage selector 10b that perform voltage selection on the basis of the logic of the drive enhancement signal output from the enhancement time setting unit 3. The first voltage selector 10a selects either the voltage Vbias4a or Vbias4b and outputs the selected voltage as the bias voltage Vbias4. The second voltage selector 10b selects either the voltage Vbias5a or Vbias5b and outputs the selected voltage as the bias voltage Vbias5. The voltage Vbias4a is, for example, about 1.0 V higher than the voltage Vbias4b. Similarly, the voltage Vbias5a is, for example, about 1.0 V lower than the voltage Vbias5b. The first voltage selector 10a and the second voltage selector 10b in the bias selector 10 select voltages Vbias4a and Vbias5a when the drive enhancement signal is a high potential, for example, and selects voltages Vbias4b and Vbias5b when the drive enhancement signal is a low potential, for example.

Next, operation of the semiconductor amplifier circuit 1 according to the present embodiment will be described. The semiconductor amplifier circuit 1 starts operation when the differential input signals Vip and Vin are input to the differential input circuit 5. For example, when Vip>Vin is satisfied, the drain current of the PMOS transistor Q4 in FIG. 3 is greater than the drain current of the PMOS transistor Q3. This increases the current flowing between the drain and source of the NMOS transistor Q11 in the current adder 6. This raises both gate voltages of the NMOS transistors Q11 and Q12. Since the drain current of the PMOS transistor Q4 is greater than the drain current of the PMOS transistor Q3, the drain voltage of the PMOS transistor Q4 is higher than the drain voltage of the PMOS transistor Q3. That is, when the drain current of the PMOS transistor Q4 increases, the drain voltage of the PMOS transistor Q3 decreases accordingly.

This increases the gate-source voltage Vgs of the NMOS transistor Q10 and decreases the drain voltage of the NMOS transistor Q10, that is, the output voltage of the current adder 6. In this manner, when Vip>Vin is satisfied, the output voltage of the current adder 6 decreases.

In contrast, when Vip≤Vin, the drain current of the PMOS transistor Q3 is greater than the drain current of the PMOS transistor Q4, and the drain voltage of the PMOS transistor Q3 is higher than the drain voltage of the PMOS transistor Q4. Accordingly, the gate-source voltage Vgs of the NMOS transistor Q10 decreases, leading to an increase in the drain voltage of the NMOS transistor Q10, that is, the output voltage of the current adder 6. In this manner, when Vip≤Vin, the output voltage of the current adder 6 increases.

A decrease in the output voltage of the current adder 6 leads to a decrease in the gate voltage of the PMOS transistor Q17 in the gate driver 2. Accordingly, the source voltage of the PMOS transistor Q17 decreases and the gate-source voltage Vgs of the NMOS transistor Q16 increases. This results in a decrease in the voltage level of the first gate drive signal connected to the drain of the NMOS transistor Q16. This causes the PMOS transistor Q1 in the output circuit 4 to operate to turn on, increasing the voltage at the output terminal OUT. In this manner, when Vip>Vin is satisfied, the output voltage of the current adder 6 decreases and the voltage at the output terminal OUT is pulled up. Since the output terminal OUT is connected to the gate of the PMOS transistor Q3 to which the second input signal Vin is input, feedback control is performed so as to suppress the voltage rise at the output terminal OUT.

Conversely, a rise in the output voltage of the current adder 6 leads to a rise in the gate voltage of the NMOS transistor Q15 in the gate driver 2. Accordingly, the source voltage of the NMOS transistor Q15 rises, leading to a rise in a voltage level of the second gate drive signal connected to the drain of the PMOS transistor Q18. In this manner, when Vin>Vip is satisfied, the output voltage of the current adder 6 rises and the voltage at the output terminal OUT is pulled down. Since the output terminal OUT is connected to the gate of the PMOS transistor Q3 to which the second input signal Vin is input, feedback control is performed so as to suppress the voltage fall at the output terminal OUT.

Moreover, when the differential input signals Vip and Vin change transiently, the first comparator 7 outputs a high potential signal when Vip>Vin+offset voltage Vofst is satisfied, and the second comparator 8 outputs a high potential signal when Vin>Vip+offset voltage Vofst is satisfied.

The OR circuit 9 outputs a high potential signal when the output of either the first comparator 7 or the second comparator 8 is a high potential. When the output of the OR circuit 9 indicates a high potential, the enhancement time setting unit 3 sets the drive enhancement signal to the first logic (for example, high level) for a predetermined time and sets the signal to the second logic (for example, low level) otherwise. The output of the OR circuit 9 indicates high potential for a predetermined period after the input voltage difference of the differential input signal exceeds the offset voltage Vofst.

When the drive enhancement signal is set to the first logic, the bias selector 10 increases the voltage level of the bias voltage Vbias4 and decreases the voltage level of Vbias5, as compared to the case where the drive enhancement signal is the second logic. This enhances the drive capability of the transistors Q16 and Q18 included in the gain adjuster 2b in the gate driver 2, and will lower the voltage level of the first gate drive signal Vg1, or raise the voltage of the second gate drive signal Vg2. This will increase the operating speeds of the PMOS transistor Q1 and the NMOS transistor Q2 in the output circuit 4.

Figure 5:
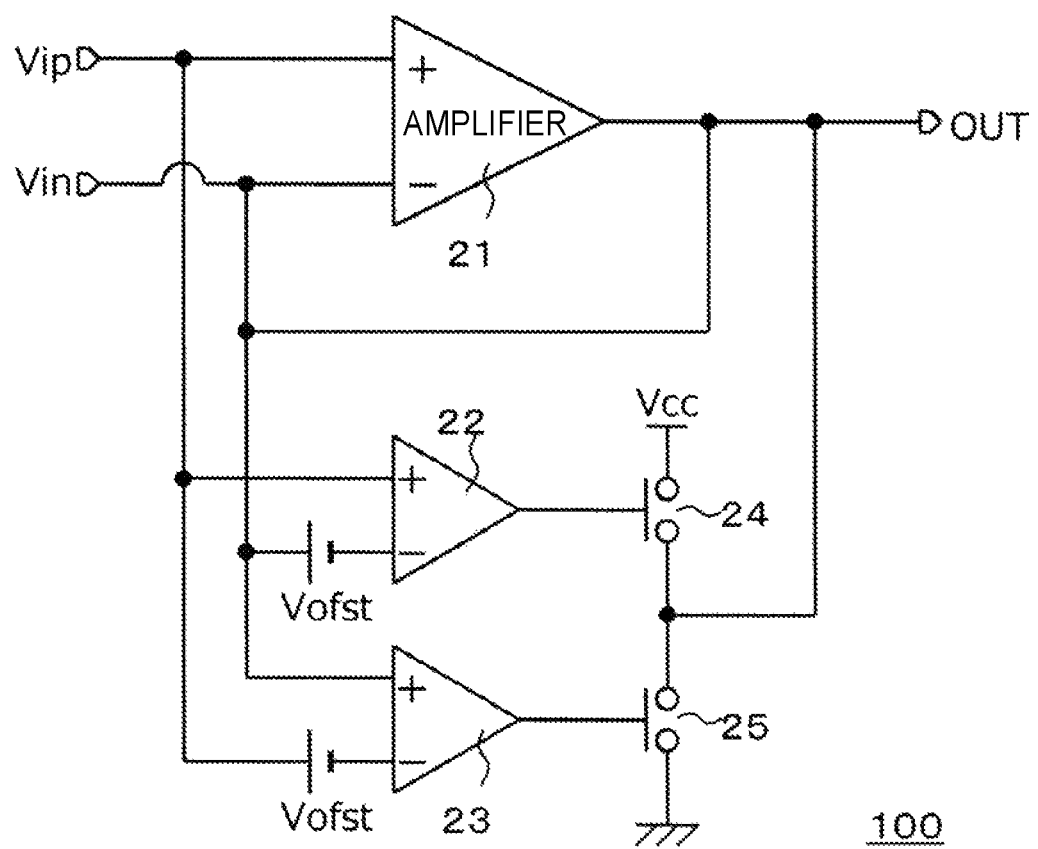
FIG. 5 is a block diagram illustrating a schematic configuration of a semiconductor amplifier circuit according to a comparative example.

FIG. 5 is a block diagram illustrating a schematic configuration of the semiconductor amplifier circuit 100 according to a comparative example. The semiconductor amplifier circuit 100 of FIG. 5 includes an amplifier 21, a first comparator 22, a second comparator 23, a first switch 24, and a second switch 25.

The amplifier 21 outputs, from the output terminal OUT, a voltage signal corresponding to the input voltage difference between the first input signal Vip and the second input signal Vin included in the differential input signal and causes the voltage signal to be short-circuited to the second input signal Vin so as to be fed back to the negative input terminal of the amplifier 21.

The first switch 24 and the second switch 25 are connected in series between the power supply voltage Vcc node and the ground node, having a configuration similar to the output circuit 4 in FIG. 1. Moreover, the first comparator 22 and the second comparator 23 have configurations similar to the configurations of the first comparator 22 and the second comparator 23 of FIG. 1.

When the first input signal Vip changes, the amplifier 21 attempts to change the voltage at the output terminal OUT. However, the voltage at the output terminal OUT and the first input signal Vip might be a voltage greatly shifted from each other transiently. The first comparator 22 and the second comparator 23 short-circuit the output terminal OUT to the power supply voltage node or the ground node in a case where the voltage difference between the first input signal Vip and the second input signal Vin is the offset voltage Vofst or more. By this short circuit, the voltage at the output terminal OUT changes rapidly, making it possible to reduce the voltage difference between the voltage at the output terminal OUT and the first input signal Vip.

Figure 6:
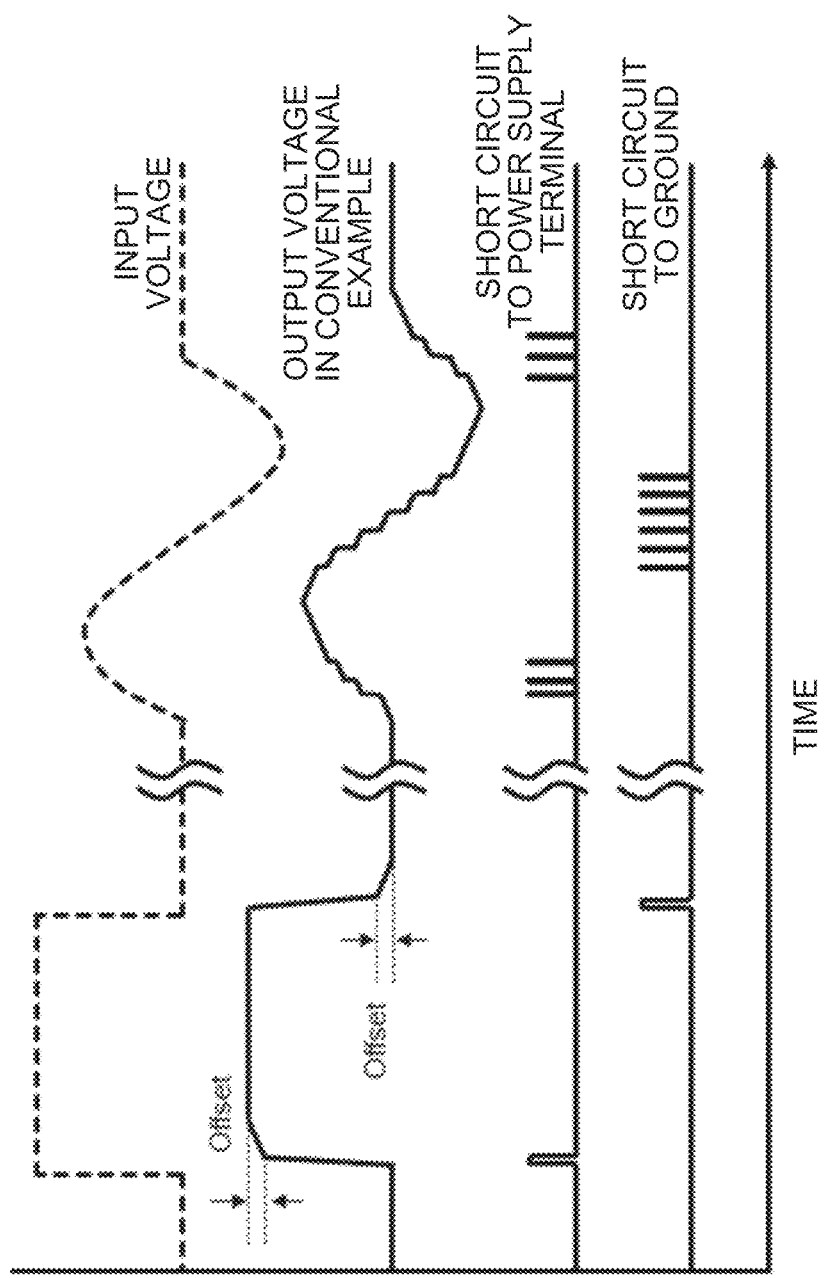
FIG. 6 is a voltage waveform diagram of individual parts in the semiconductor amplifier circuit of FIG. 5.

FIG. 6 is a voltage waveform diagram of individual parts in the semiconductor amplifier circuit 1 of FIG. 5. In FIG. 6, the uppermost diagram represents the voltage waveform of the first input signal Vip, the second diagram represents a voltage waveform of the output terminal OUT, the third diagram is a pulse waveform indicating a period in which the output terminal OUT is short-circuited to the power supply voltage node, and the fourth diagram represents a pulse waveform indicating a period in which the output terminal OUT is short-circuited to the ground node.

When a rectangular wave rises in the input signal, the output of the first comparator 22 indicates a high potential when the input voltage difference between the differential input signals Vip and Vin becomes the offset voltage Vofst or more. This turns on the first switch 24 and causes the output terminal OUT to be short-circuited to the power supply voltage node, resulting in a rapid rise in the voltage at the output terminal OUT. Thereafter, when the input voltage difference becomes less than the offset voltage Vofst, the first switch 24 is turned off, making the slope of the voltage rise at the output terminal OUT gradual. Finally, the voltage at the output terminal OUT will take a waveform corresponding to the voltage waveform of the first input signal Vip. Similar operation is performed when a rectangular wave falls in the input signal.

In contrast, when the voltage waveform of the first input signal Vip is a sine wave, the voltage at the output terminal OUT changes gradually until the input voltage difference between the differential input signals Vip and Vin reaches the offset voltage Vofst. When the input voltage difference is the offset voltage Vofst or more, the first switch 24 is turned on, and the voltage at the output terminal OUT rapidly rises to the power supply voltage node. Thereafter, when the input voltage difference falls below the offset voltage Vofst, the first switch 24 is turned off, and the voltage at the output terminal OUT changes gradually. When the voltage waveform of the first input signal Vip is a sine wave, the voltage level of the input signal constantly changes. This causes the first switch 24 to alternately turn on and off, resulting in a stepwise change in the voltage at the output terminal OUT. In addition, if the input voltage difference continues to be less than the offset voltage Vofst when the input signal voltage level approaches the peak or bottom, the voltage at the output terminal OUT would change with a gradual slope with a remaining input voltage difference. This leads to formation of the voltage waveform of the original input signal and the voltage waveform of the output terminal OUT with a great difference from each other, leading to an increase in the distortion of the voltage waveform of the output terminal OUT.

Figure 7:
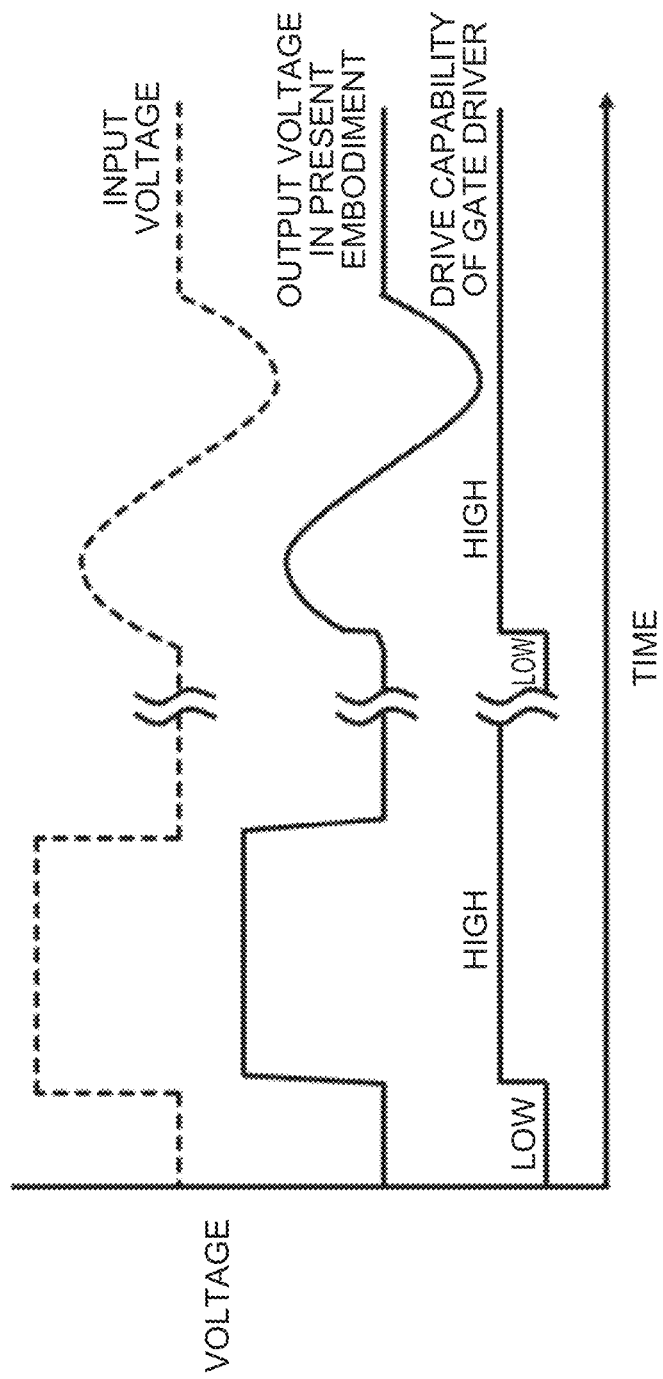
FIG. 7 is a voltage waveform diagram of individual parts in the semiconductor amplifier circuit according to the present embodiment.

FIG. 7 is a voltage waveform diagram of individual parts in the semiconductor amplifier circuit 1 according to the present embodiment. In FIG. 7, the uppermost diagram represents a voltage waveform of the first input signal Vip, the second diagram represents a voltage waveform of the output terminal OUT, and the third diagram represents a waveform indicating drive capability of the gate driver 2. The third waveform has a high level when the drive capability is high and a low level when the drive capability is low.

In the present embodiment, the output terminal OUT is not to be short-circuited to the power supply voltage node or the ground node. The drive capability of the gate drive signal is temporarily increased when the input voltage difference of the differential input signal fluctuates transiently and the gate drive signal is set to a low drive capability in other situations. Accordingly, the voltage of the output terminal OUT can be changed following the voltage change of the differential input signal. More specifically, when the first input signal Vip includes a rising edge having a rectangular wave shape, the gate driver 2 rapidly increases the drive capability of the gate drive signal, leading to formation of the rectangular voltage waveform of the output terminal OUT. In contrast, when the first input signal Vip is a sine wave, the voltage at the output terminal OUT gradually increases until the input voltage difference between the differential input signals exceeds the offset voltage Vofst. The voltage at the output terminal OUT suddenly rises when the input voltage difference exceeds the offset voltage Vofst, and then the gate driver 2 increases the drive capability. Accordingly, it is possible to change the voltage waveform of the output terminal OUT following the change in the waveform of the first input signal Vip for a predetermined period. With this configuration, it is possible to improve distortion characteristics while suppressing power consumption.

Figure 8:
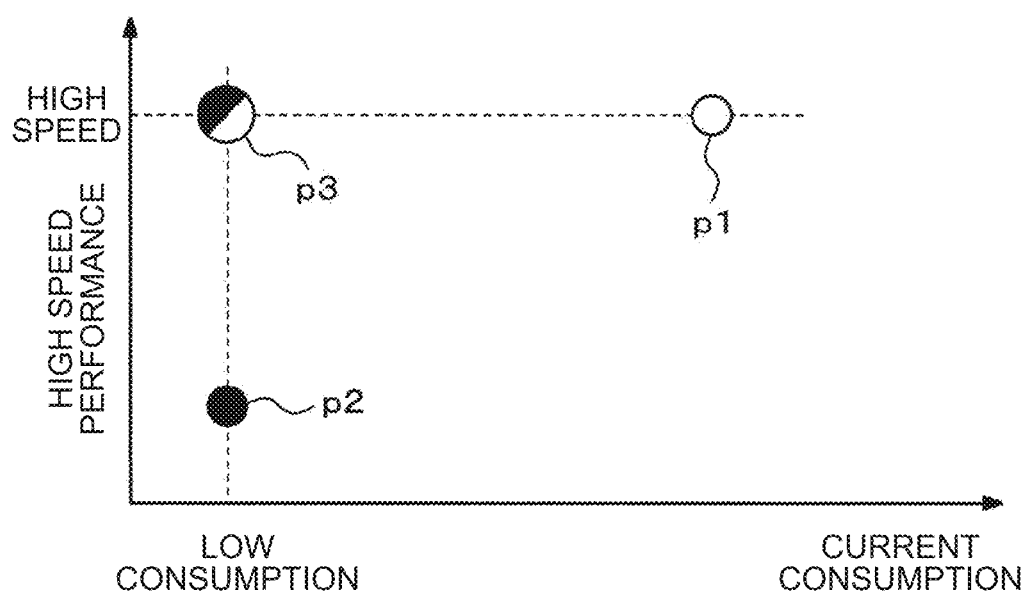
FIG. 8 is a diagram schematically illustrating a relationship between current consumption and high speed performance.

FIG. 8 is a diagram schematically illustrating a relationship between current consumption and high speed performance. In general, current consumption and high speed performance are in a trade-off relationship, that is, the higher the current consumption, the higher the speed (plot p1), and the lower the current consumption, the lower the speed (plot p2). In this regard, the present embodiment is configured to improve the drive capability of the gate driver 2 only when high speed performance is required, such as when the input voltage difference of the differential input signal becomes large, and lowers the drive capability of the gate driver 2 when high speed performance is not particularly required. Therefore, according to the present embodiment, it is possible to maintain high speed performance while suppressing overall power consumption, as illustrated by plot p3 in FIG. 8.

In this manner, the present embodiment is configured to detect the fact that the input voltage difference of the differential input signal is the offset voltage Vofst or more, and enhances the drive capability of the gate driver 2 for a predetermined period after the input voltage difference becomes the offset voltage Vofst or more. This configuration can suppress distortion of the voltage at the output terminal OUT and can rapidly perform feedback operation so as to eliminate the input voltage difference between the differential input signals. In addition, the drive capability of the gate driver 2 is lowered during a period other than the predetermined period, making it possible to reduce power consumption.

Second Embodiment

Figure 9:
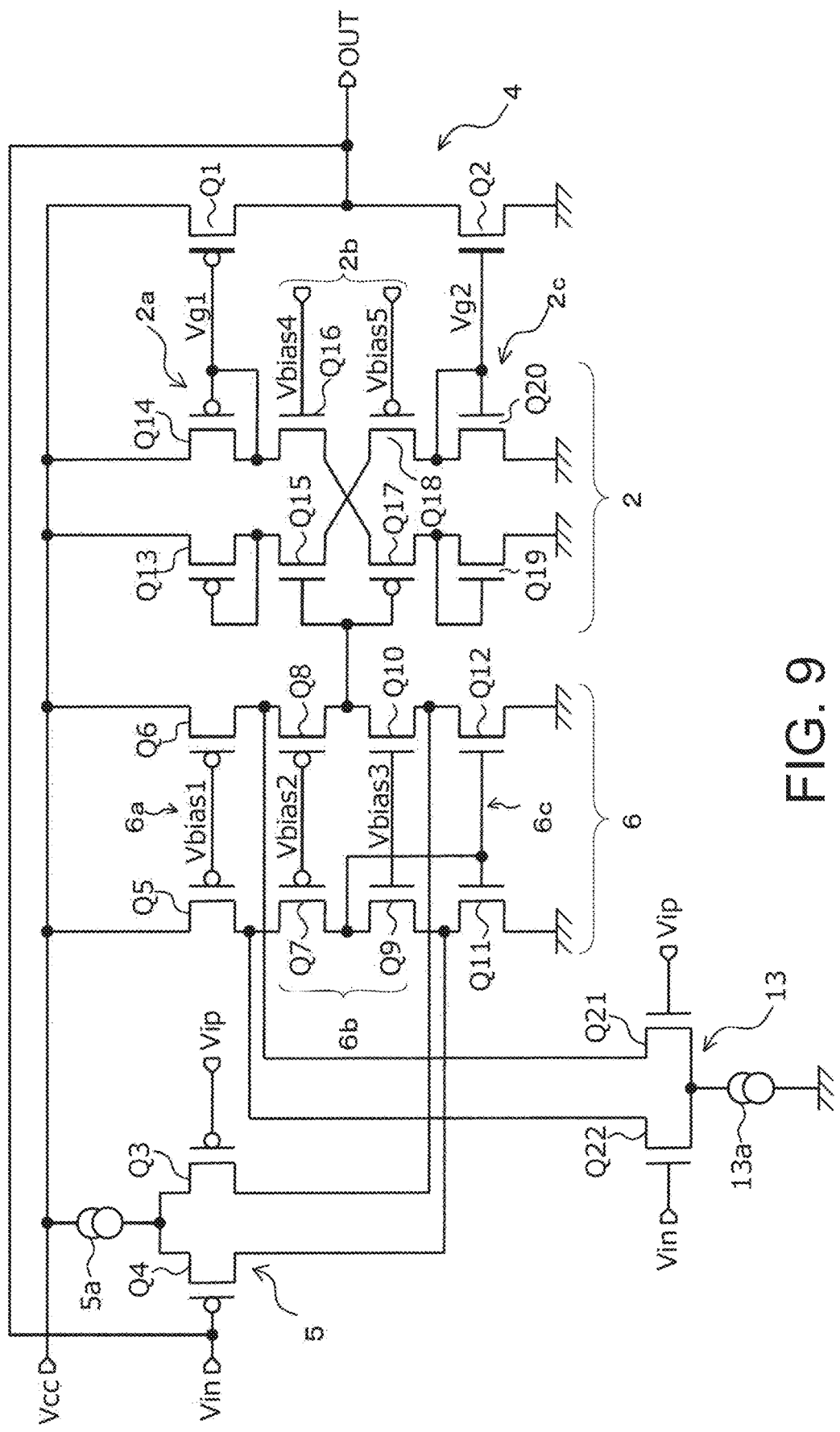
FIG. 9 is a circuit diagram of a semiconductor amplifier circuit according to a second embodiment.

FIG. 9 is a circuit diagram of the semiconductor amplifier circuit 1 according to a second embodiment. The semiconductor amplifier circuit 1 of FIG. 9 is obtained by adding an n-type differential input circuit 13 having a pair of NMOS transistors Q21 and Q22 and a constant current source 13a to the configuration of the semiconductor amplifier circuit 1 of FIG. 3. Hereinafter, the differential input circuit 5 illustrated in FIGS. 1 and 3 will be referred to as a p-type differential input circuit 5.

Similarly to FIG. 3, the drains of the PMOS transistors Q3 and Q4 in the p-type differential input circuit 5 are connected to the drains of the transistors Q12 and Q11 in the current adder 6, respectively. In contrast, the drains of the NMOS transistors Q21 and Q22 in the n-type differential input circuit 13 of FIG. 3 are connected to the drains of the PMOS transistors Q6 and Q5 in the current adder 6, respectively.

The constant current source 13a is connected to the sources of the NMOS transistors Q21 and Q22. Differential input signals Vip and Vin are connected to the gates of the NMOS transistors Q21 and Q22, respectively.

The semiconductor amplifier circuit 1 in FIG. 9 includes the p-type differential input circuit 5 and the n-type differential input circuit 13 having mutually different conductivity types, making it possible to expand the common-mode input voltage range of the differential input signal. Here, a common-mode input voltage Vcom is an average value=(Vip+Vin)/2, that is, an average of the differential input voltages Vip and Vin. When the differential input voltages Vip and Vin are steady, Vip=Vin=Vcom is established.

The common-mode input voltage represents a range of the common-mode input voltage Vcom that can operate as an amplifier circuit in consideration of a drain-source voltage Vds and the gate-source voltage Vgs.

Figure 10:
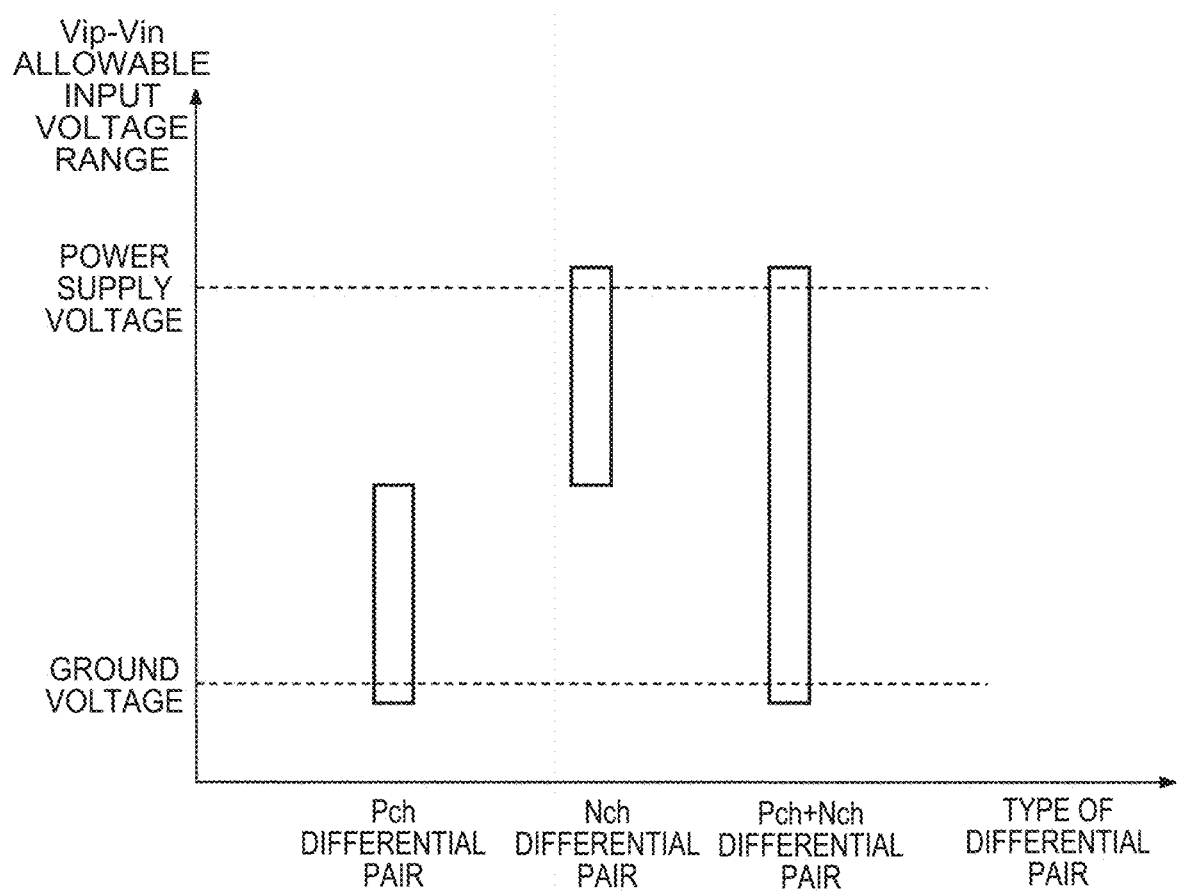
FIG. 10 is a comparison diagram of common-mode input voltage ranges.

FIG. 10 is a diagram illustrating a comparison of the common-mode input voltage range in cases where the p-type differential input circuit 5, the n-type differential input circuit 13, or the p-type differential input circuit 5+n type differential input circuit 13 is provided in the semiconductor amplifier circuit 1. When the p-type differential input circuit 5 alone is provided, a differential input voltage in a voltage range close to the power supply voltage cannot be input. When the n-type differential input circuit 13 alone is provided, a differential input voltage in a voltage range close to the ground voltage cannot be input. In contrast, when the p-type differential input circuit 5 and the n-type differential input circuit 13 are provided, it is possible to support differential input voltages within a wide voltage range from the ground voltage side to the power supply voltage side, making it possible to relax restriction on the voltage range of the differential input voltage.

Note that in a case where the voltage range of the differential input voltage is determined in advance, the circuit configuration can be further simplified by providing the p-type differential input circuit 5 alone or the n-type differential input circuit 13 alone than in a case where two sets of differential input circuits 5 are provided as illustrated in FIG. 9

In this manner, in the second embodiment, with two sets of differential input circuits 5 having different conductivity types, it is possible to expand the common-mode input range of differential input signals.

Third Embodiment

Although the first and second embodiments includes the current adder 6 that adds the current from the constant current to the current flowing through the differential input circuit 5, it is also allowable to use a configuration that omits the current adder 6.

Figure 11:
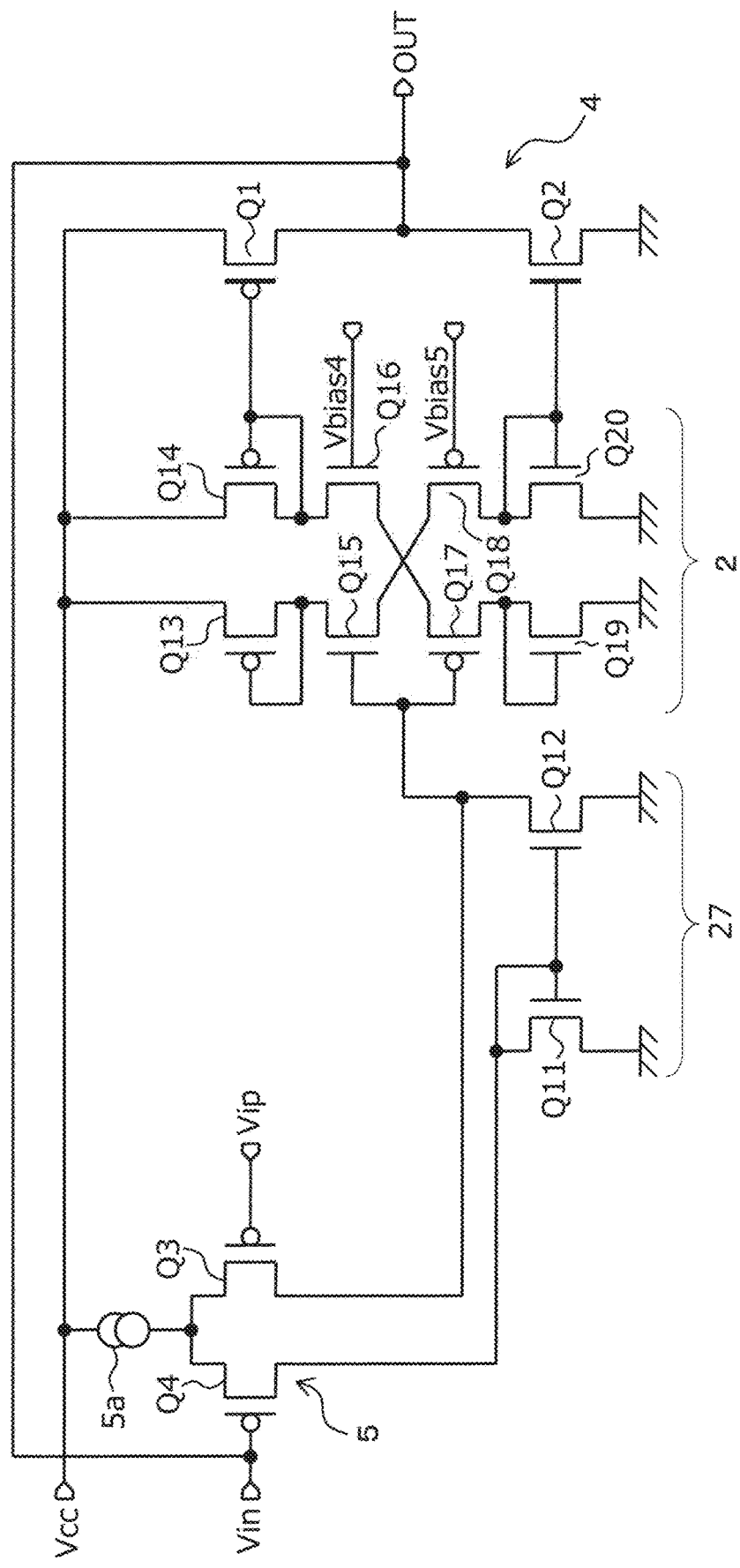
FIG. 11 is a circuit diagram of a semiconductor amplifier circuit according to a third embodiment.

FIG. 11 is a circuit diagram of the semiconductor amplifier circuit 1 according to a third embodiment. The semiconductor amplifier circuit 1 of FIG. 11 includes a current detector 27 instead of the current adder 6.

The current detector 27 includes a pair of NMOS transistors Q11 and Q12 in the current adder 6 of FIG. 3. That is, in the semiconductor amplifier circuit 1 of FIG. 11, the transistors Q5 to Q10 in the current adder 6 of FIG. 3 are omitted.

The drain currents of the PMOS transistors Q3 and Q4 in the differential input circuit 5 flow between the source and drain of the NMOS transistors Q12 and Q11, respectively. The drain of the NMOS transistor Q12 is connected to the gates of the transistors Q15 and Q17 in the gate driver 2.

The differential input circuit 5 outputs a current corresponding to the input voltage difference of the differential input signal. The current detector 27 generates a voltage for controlling the gate driver 2 directly using the current output from the differential input circuit 5. Therefore, in a case where the current detector 27 is used, the gain would be several tens of times lower than the case where the current adder 6 is used. Still, in consideration of an advantage of greatly simplifying the circuit configuration, the semiconductor amplifier circuit 1 illustrated in FIG. 11 is applicable when gain requirement is not so strict.

Figure 12:
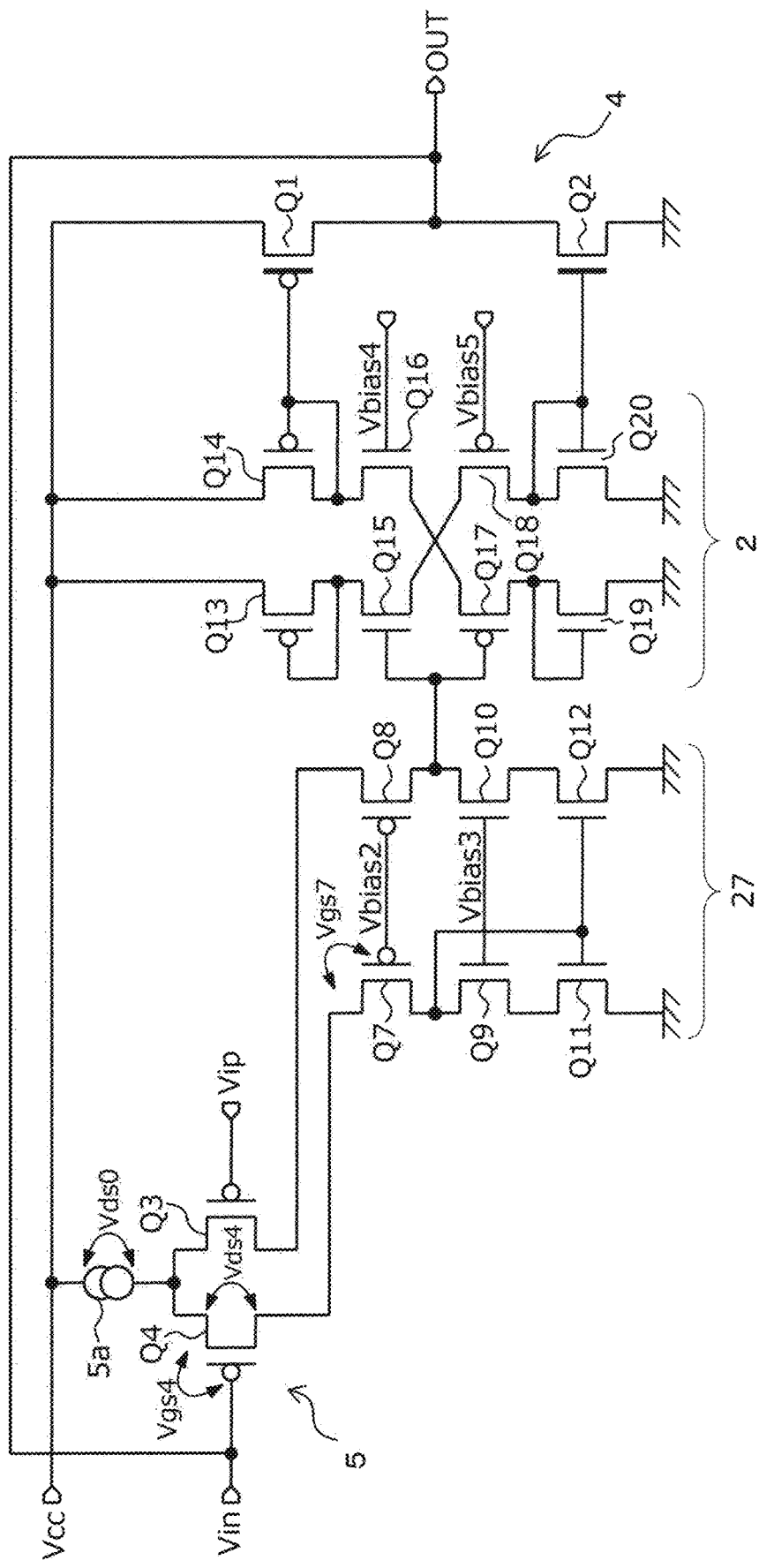
FIG. 12 is a circuit diagram of a semiconductor amplifier circuit according to a modification of the third embodiment.

FIG. 12 is a circuit diagram of a semiconductor amplifier circuit 1 according to a modification of the third embodiment. The semiconductor amplifier circuit 1 of FIG. 12 has a configuration of the current detector 27 different from that of FIG. 11. The current detector 27 in FIG. 12 includes transistors Q7 to Q12 out of the configuration of the current adder 6 in FIG. 3, and only the transistors Q5 and Q6 included in the constant current source 6a are omitted.

In the semiconductor amplifier circuit 1 of FIG. 12, the drains of the PMOS transistors Q4 and Q3 in the differential input circuit 5 are connected to the sources of the PMOS transistors Q7 and Q8 in the current detector 27. Since the transistors Q5 and Q6 are omitted in the current detector 27 of FIG. 12, no current is added in the transistors Q11 or Q12. Still, the gain can be enhanced by the transistors Q7 to Q10. Therefore, the semiconductor amplifier circuit 1 of FIG. 12 can obtain the gain equivalent to the case of the semiconductor amplifier circuit 1 of FIG. 3, with the common-mode input range of the differential input signal narrower than the case of the semiconductor amplifier circuit 1 of FIG. 3, FIG. 13A is a diagram illustrating a common-mode input range of the semiconductor amplifier circuit 1 of FIG. 3, FIG. 13B is a diagram illustrating a common-mode input range of the semiconductor amplifier circuit 1 of FIG. 12.

Figure 13A:
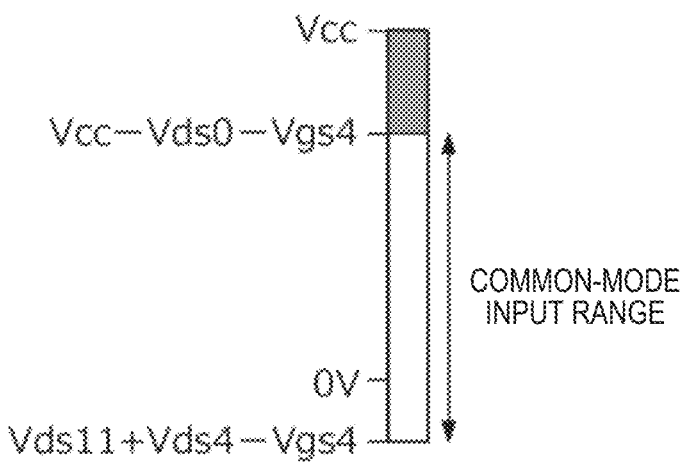
FIG. 13A is a diagram illustrating a common-mode input range of the semiconductor amplifier circuit of FIG. 3.

In FIG. 13A, the voltage across the current source 5a in the differential input circuit 5 is Vds0, the gate-source voltage of the PMOS transistors Q3 and Q4 is Vgs4, the drain-source voltage of the PMOS transistors Q3 and Q4 is Vds4, and the drain-source voltage of the NMOS transistor Q11 is Vds11. In this case, the common-mode input range has an upper limit of power supply voltage Vcc−Vds0−Vgs4, and has a lower limit of Vds11+Vds4−Vgs4.

Figure 13B:
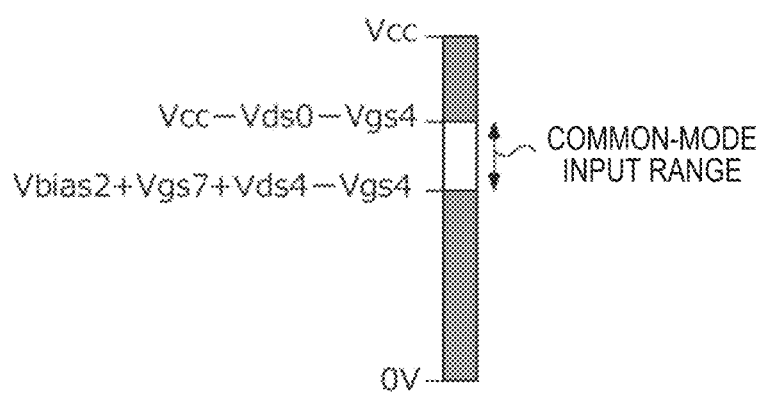
FIG. 13B is a diagram illustrating a common-mode input range of the semiconductor amplifier circuit of FIG. 12.

In FIG. 13B, the gate-source voltage of the PMOS transistor Q7 is Vgs7. In this case, the common-mode input range has an upper limit of the power supply voltage Vcc−Vds0−Vgs4 and has a lower limit of Vbias2+Vgs7+Vds4−Vgs4.

As observed from FIGS. 13A and 13B, the semiconductor amplifier circuit 1 in FIG. 12 has a narrower common-mode input range than the semiconductor amplifier circuit 1 in FIG. 3. Still, when it is known in advance that the fluctuation of the voltage range of the differential input voltage is small, the semiconductor amplifier circuit 1 of FIG. 12 can be used to simplify the circuit configuration.

In this manner, although there is a disadvantage in the third embodiment such as reduction in the gain or reduction in the common-mode input range, it is still possible to simplify the circuit configuration of the semiconductor amplifier circuit 1 in a case where the variation range of the differential input voltage is narrow.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor amplifier circuit comprising:
   a driver that outputs a drive signal corresponding to an input signal and switches drive capability of the drive signal in accordance with a logic of an instruction signal, the input signal being a differential input signal comprising a first input signal and a second input signal that have a same voltage level during a stable time period and have voltage levels temporarily different from each other when a signal logic transitions;
   an instruction signal setting unit that sets the logic of the instruction signal in accordance with whether the input signal satisfies a predetermined condition;
   an output circuit that comprises a control terminal to which the drive signal is input and an output terminal that outputs a signal obtained by amplifying the input signal;
   a first comparator that detects whether a first voltage difference obtained by subtracting the voltage level of the second input signal from the voltage level of the first input signal is greater than a predetermined reference voltage; and
   a second comparator that detects whether a second voltage difference obtained by subtracting the voltage level of the first input signal from the voltage level of the second input signal is greater than the reference voltage, and
   a logical operation circuit that outputs a signal of a predetermined logic in a case where the first comparator detects that the first voltage difference is the reference voltage or less, or in a case where the second comparator detects that the second voltage difference is the reference voltage or less,
   wherein the instruction signal setting unit comprises a capacitor that stores charges immediately after the logical operation circuit outputs the signal of the predetermined logic and that discharges the stored charges over time after the logical operation circuit outputs a signal of a logic other than the predetermined logic,
   the instruction signal setting unit sets the instruction signal to a first logic in a case where the capacitor stores charges of a predetermined amount or more, and
   the driver enhances the drive capability of the drive signal during a period in which the instruction signal is a first logic.

2. The semiconductor amplifier circuit according to claim 1,
   wherein
   the instruction signal setting unit sets the instruction signal to the first logic for a predetermined time after the differential input signal satisfies a predetermined condition, and transitions the instruction signal to a second logic when the predetermined time elapses, and
   the output circuit comprises a transistor having the control terminal to which the drive signal is input, and outputs an amplified signal obtained by amplifying the differential input signal, from the output terminal of the transistor.

3. The semiconductor amplifier circuit according to claim 1, further comprising:
   a first conductivity type first transistor pair that outputs a current corresponding to a voltage difference between the first input signal and the second input signal; and
   a current adder that outputs a voltage corresponding to a current obtained by adding a current from a constant current source to the current output from the first transistor pair,
   wherein the driver outputs the drive signal corresponding to the voltage output from the current adder.

4. The semiconductor amplifier circuit according to claim 3, further comprising
   a second conductivity type second transistor pair that outputs a current corresponding to a voltage difference between the first input signal and the second input signal,
   wherein the current adder outputs a voltage corresponding to a current obtained by adding a current from the constant current source to a current output from the first transistor pair and the second transistor pair.

5. The semiconductor amplifier circuit according to claim 3,
   wherein the amplified signal output from the output circuit is negatively fed back to a gate of one of the first transistor pairs.

6. The semiconductor amplifier circuit according to claim 1, further comprising a bias selector that outputs a bias voltage having a different voltage level depending on whether the instruction signal is set to the first logic or the second logic,
   wherein the driver switches the drive capability of the drive signal in accordance with the bias voltage output from the bias selector.

7. A semiconductor circuit comprising:
   a driver that generates a drive signal corresponding to an input signal and switches drive capability of the drive signal in accordance with a logic of an instruction signal, the drive signal being input to a control terminal of an output circuit for amplifying the input signal, the input signal being a differential input signal comprising a first input signal and a second input signal that have a same voltage level during a stable time period and have voltage levels temporarily different from each other when a signal logic transitions;
   an instruction signal setting unit that sets the logic of the instruction signal in accordance with whether the input signal satisfies a predetermined condition;
   a first comparator that detects whether a first voltage difference obtained by subtracting the voltage level of the second input signal from the voltage level of the first input signal is greater than a predetermined reference voltage; and
   a second comparator that detects whether a second voltage difference obtained by subtracting the voltage level of the first input signal from the voltage level of the second input signal is greater than the reference voltage, and a logical operation circuit that outputs a signal of a predetermined logic in a case where the first comparator detects that the first voltage difference is the reference voltage or less, or in a case where the second comparator detects that the second voltage difference is the reference voltage or less, wherein the instruction signal setting unit comprises a capacitor that stores charges immediately after the logical operation circuit outputs the signal of the predetermined logic and that discharges the stored charges over time after the logical operation circuit outputs a signal of a logic other than the predetermined logic, the instruction signal setting unit sets the instruction signal to a first logic in a case where the capacitor stores charges of a predetermined amount or more, and the driver enhances the drive capability of the drive signal during a period in which the instruction signal is a first logic.

8. The semiconductor circuit according to claim 7, wherein the instruction signal setting unit sets the instruction signal to the first logic for a predetermined time after the input signal satisfies a predetermined condition, and transitions the differential instruction signal to a second logic when the predetermined time elapses.

9. The semiconductor circuit according to claim 7, further comprising:

a first conductivity type first transistor pair that outputs a current corresponding to a voltage difference between the first input signal and the second input signal; and a current adder that outputs a voltage corresponding to a current obtained by adding a current from a constant current source to the current output from the first transistor pair, wherein the driver outputs the drive signal corresponding to the voltage output from the current adder.

10. The semiconductor circuit according to claim 9, further comprising a second conductivity type second transistor pair that outputs a current corresponding to a voltage difference between the first input signal and the second input signal, wherein the current adder outputs a voltage corresponding to a current obtained by adding a current from the constant current source to a current output from the first transistor pair and the second transistor pair.

11. The semiconductor circuit according to claim 9, wherein the signal amplified by the output circuit is negatively fed back to a gate of one of the first transistor pairs.

12. The semiconductor circuit according to claim 7, further comprising a bias selector that outputs a bias voltage having a different voltage level depending on whether the instruction signal is set to the first logic or the second logic, wherein the driver switches the drive capability of the drive signal in accordance with the bias voltage output from the bias selector.

\* \* \* \* \*